(12) United States Patent
Bolton et al.

(10) Patent No.: US 7,183,822 B1
(45) Date of Patent: Feb. 27, 2007

(54) LOW-VOLTAGE, LOW STATIC PHASE OFFSET DIFFERENTIAL CHARGE PUMP

(75) Inventors: Eric K. Bolton, Broomfield, CO (US); Steven Meyers, Round Rock, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 190 days.

(21) Appl. No.: 10/927,979

(22) Filed: Aug. 27, 2004

Related U.S. Application Data

(60) Provisional application No. 60/503,535, filed on Sep. 16, 2003.

(51) Int. Cl.
*H03L 7/06* (2006.01)
(52) U.S. Cl. ..................................................... 327/157
(58) Field of Classification Search ................ 327/148, 327/308; 331/DIG. 2; 375/374, 376
See application file for complete search history.

(56) References Cited

U.S. PATENT DOCUMENTS

| | | | |
|---|---|---|---|
| 5,363,066 A * | 11/1994 | Chen et al. ................ 331/17 |
| 5,670,869 A | 9/1997 | Weisenbach ............... 323/313 |
| 6,141,169 A * | 10/2000 | Pietruszynski et al. ....... 360/67 |
| 6,222,402 B1 | 4/2001 | Boerstler et al. .......... 327/157 |
| 6,384,638 B1 | 5/2002 | Nayebi et al. .............. 327/65 |
| 6,452,441 B1 | 9/2002 | Kim et al. ................. 327/544 |
| 6,879,816 B2 * | 4/2005 | Bult et al. ............... 455/232.1 |

* cited by examiner

*Primary Examiner*—My-Trang Nu Ton
(74) *Attorney, Agent, or Firm*—Kevin L. Daffer; Daffer McDaniel, LLP

(57) ABSTRACT

A charge pump circuit with resistively attenuated inputs is described herein. By reducing a voltage swing of input signals supplied thereto, the charge pump circuit described herein is configured for producing output signals with relatively low static phase offset even when operating at relatively low power supply voltages (e.g., less than about 1.2 volts). In general, the input voltage swing may be reduced by coupling an attenuator to each input of the charge pump circuit. A method for operating the differential charge pump is described, along with exemplary devices (e.g., PLL and DLL devices) within which the charge pump may be utilized.

19 Claims, 7 Drawing Sheets

LOW-VOLTAGE, LOW STATIC PHASE OFFSET DIFFERENTIAL CHARGE PUMP

PRIORITY APPLICATION

This application claims priority to U.S. Provisional Application No. 60/503,535 entitled "Low-Voltage Low Static Phase Offset Differential Charge Pump," filed Sep. 16, 2003 and incorporated herein in its entirety.

BACKGROUND OF THE INVENTION

1. Field of the Invention

The present invention relates generally to electronic circuits, and in particular, to charge pump circuits, which operate at relatively low power supply voltages and produce output signals with relatively low static phase offset.

2. Description of the Related Art

The following descriptions and examples are not admitted to be prior art by virtue of their inclusion within this section.

A charge pump is a circuit that delivers a certain amount of current for a certain amount of time. More specifically, a charge pump is a circuit that receives a pair of input pulses and connects either a constant current source or a constant current sink to an output line depending on which input pulse is active. The output connection generally lasts for the duration of the input pulse.

One use for a charge pump is in a phase-lock loop circuit. Phase-locked loops (PLLs) are routinely used for data and telecommunications, frequency synthesis, clock recovery, and similar applications. In some cases, PLLs may be used in the input/output (I/O) interfaces of digital integrated circuits to hide clock distribution delays and to improve overall system timing. In general, a PLL may be used to generate one or more clocking signals that are in phase alignment with a reference clock signal. More specifically, a PLL is a closed-loop device that uses a Phase Frequency Detector (PFD), a charge pump (CP), a low pass filter, and a voltage-controlled oscillator (VCO) to obtain accurate phase alignment between the generated clocking signal and the reference clock signal. The PFD detects the difference between the reference clock signal and a clock signal (referred to below as a feedback clock) generated by the VCO and fed back to the PFD. Output signals from the PFD activate the charge pump for an amount of time substantially equal to the difference between corresponding edges of the reference and feedback clock signals. The PLL may then use the output current generated by the charge pump as an error signal, which is used to correct the phase offset between the reference signal and the VCO generated clocking signal. In this manner, the PLL may be ideally configured for generating one or more clocking signals, which demonstrate a relatively low (and preferably zero) static phase offset from the reference signal at the lock point.

Conventional charge pump circuits are typically driven with inputs received directly from the phase frequency detector (PFD). As such, the inputs generally exhibit rail-to-rail voltage swings (e.g., from about 0 V to about 1.2 V in some processes). As used herein, a signal with a "rail-to-rail voltage swing" has a magnitude equal to the difference between the power supply voltage (e.g., VDD) and a ground potential (e.g., VSS). As such, the signal magnitude may fluctuate with variations in the power supply voltage. An exemplary conventional charge pump solution is shown in FIGS. 1A and 1B. This conventional charge pump solution generally includes two identically-formed differential current-steering circuits 100, 150, one for supplying a positive control voltage ($VCO_{UP}$), and one for supplying a negative control voltage ($VCO_{DN}$) to the VCO. The current-steering circuits of FIGS. 1A and 1B each include an n-channel metal oxide semiconductor (NMOS) transistor current source ($I_N$), a p-channel metal oxide semiconductor (PMOS) transistor current source ($I_P$), two NMOS switching transistors (N1, N2) and two PMOS switching transistors (P1, P2). The switching transistors (N1, N2, P1, P2) are driven directly from the PFD; they deliver current to the $VCO_{UP}$ and $VCO_{DN}$ nodes depending on the state of the full-swing input signals (pd_low, pd_high, pu_high, pu_low) received from the PFD circuit.

Disadvantages of the conventional charge pump solution of FIGS. 1A and 1B become evident when the charge pump operates at relatively low power supply voltages (e.g., less than about 1.2V). At low power supply voltages, the full rail input voltage swing from the PFD forces the switching transistors into the triode operating region when the switching transistors are in the "on" state. This changes the magnitude of the gate-to-drain capacitance (Cgd, sometimes referred to as the Miller Capacitance) and causes large Miller Capacitance mismatch currents to be produced at the $VCO_{UP}$ and $VCO_{DN}$ nodes. As described in more detail below, the mismatched currents may cause the PLL to lock with a significant static phase offset between the reference and feedback clock signals.

A capacitance curve for one of the PMOS switching transistors in the conventional charge pump circuit is shown in FIG. 2. As seen in FIG. 2, the Miller capacitance (Cgd) varies between approximately 0.62 femto-Farards (fF, or $10^{-15}$ Farads) and 1.69 fF from the "off" state to the "on" state of the PMOS switching transistors. Similar results may be obtained from one of the NMOS switching transistors in the charge pump circuit. The large Cgd mismatch between "on" and "off" states results in large (and therefore, undesirable) output current mismatches at the switching point of the PMOS (and NMOS) switching transistors. This forces the phase-lock loop (PLL) to generate a charge in the opposite direction to cancel out the mismatched charges during lock. The result is that the PLL locks with a relatively large static phase offset between the reference and feedback clock signals. A plot of charge vs. phase, simulated at a typical process corner and maximum VCO control voltage for the conventional technology, is shown in FIG. 3. This plot indicates a static phase offset of about 90 picoseconds (ps) for the conventional charge pump shown in FIGS. 1A and 1B.

In an ideal situation, a charge pump circuit would operate with zero Miller capacitances; however, this is not possible with conventional devices. Therefore, a need exists for a means to minimize these capacitances, and more importantly, to accurately match these capacitances between all switching transistors. In other words, it would be desirable to have a charge pump circuit that does not suffer from Miller Capacitance mismatches between "on" and "off" states of its switching transistors. It would be further desirable to have a charge pump circuit with switching transistors that demonstrate a substantially low and constant Miller Capacitance when operated at relatively low power supply voltages (e.g., less than about 1.2 V).

SUMMARY OF THE INVENTION

The problems outlined above may be in large part addressed by an improved charge pump circuit with resistively attenuated inputs. By reducing the voltage swing of input signals supplied thereto, the charge pump circuit described herein may be configured for operating at relatively low power supply voltages (e.g., less than about 1.2 volts) and producing output signals with relatively low static phase offset. As described below, the input voltage swing may be reduced by coupling an attenuator to each input of the charge pump circuit.

According to one embodiment, a differential charge pump circuit is described herein as including a first portion and a second portion. In a general aspect, the first and second portions of the differential charge pump circuit may be formed substantially identical to one another. As such, the first and second portions may be configured for producing a positive error signal or a negative error signal, respectively, depending on a state of the input signals supplied to the differential charge pump circuit.

In a more specific embodiment, the first and second portions of the differential charge pump circuit may include a first p-channel transistor and a first n-channel transistor coupled in parallel with a second p-channel transistor and a second n-channel transistor between a current source and a current sink. In some cases, a power supply coupled to the current source may be configured for supplying a voltage of less than about 1.2 volts to the differential charge pump circuit. In order to accommodate such low power supplies, the first and second p-channel and n-channel transistors may be fabricated with threshold voltages ($V_T$) ranging between about 270 mV (or lower) and about 290 mV. These ranges are provided for a given process technology and desired power supply voltage. Other threshold voltages may be appropriate depending on the particular process technology and power supply voltage used.

The differential charge pump circuit may further include a plurality of differential charge pump inputs, each coupled to a different gate terminal of the first and second p-channel and n-channel transistors of the first and second portions. In order to keep the transistors within a saturation state, an attenuator may be coupled to each of the plurality of differential charge pump inputs for reducing the amplitude of an input signal supplied thereto. In some cases, the plurality of attenuators may each include one or more resistors. In one exemplary embodiment, the plurality of attenuators may each include a Y-network of three resistors. The resistors within the Y-network may or may not have substantially equal impedance values, depending on the amount of attenuation desired to achieve a particular common mode and input voltage swing. In some cases, the Y-network may be fabricated with transistors or a combination of transistors and resistors.

According to another embodiment, a method for operating a differential charge pump circuit is described herein as including the steps of: receiving an input signal; attenuating the input signal; and supplying the attenuated input signal to the differential charge pump circuit instead of the input signal itself. In some cases, a magnitude of the input signal may range between a power supply voltage level and a ground supply voltage level supplied to the differential charge pump circuit. In other words, the input signal may have a "rail-to-rail" voltage swing. When low voltage threshold ($V_T$) transistors are used within the differential charge pump circuit, it may be desired to reduce the voltage swing of the input signal, so that the low VT transistors may be kept in saturation. For example, the step of attenuating the input signal may include reducing the magnitude of the input signal by approximately 40 to 45%. However, the reduction in magnitude may be substantially less than or greater than such a range, depending on the particular power supply voltage, the process technology, and the $V_T$ of the switching transistors. The reduction in magnitude may be achieved, in some cases, by passing the input signal through a resistive network coupled to an input of the differential charge pump circuit. As noted above, the resistive network may include a Y-network of three resistors, in some embodiments of the invention.

According to yet another embodiment, a clock signal generator including a phase frequency detector (PFD), a charge pump and a filter is described herein. The phase frequency detector may be coupled for receiving and comparing a reference clock signal with a feedback clock signal, and thus, may be configured for generating a signal representative of a difference therebetween. In a general aspect, the charge pump may include an attenuator and a switching transistor. The attenuator may be coupled for reducing a voltage swing of the signal, so that the switching transistor may receive the reduced voltage swing signal, instead of the signal itself. As noted above, the attenuator may include one or more resistors; one embodiment of which includes a Y-network of three resistors. In a more specific aspect, the charge pump may include a second attenuator and a second switching transistor. The second attenuator may be coupled for reducing a voltage swing of a complementary signal, so that the second switching transistor may receive the reduced voltage swing complementary signal, rather than the complementary signal itself. In this manner, the filter circuit may be configured for receiving a pair of currents generated by the charge pump and producing a differential control voltage by canceling matched capacitive current spikes generated within the first and second switching transistors when one of the switching transistors is in an "on" state and the other is in an "off" state.

In some cases, a voltage controlled oscillator (VCO) may be coupled for receiving the differential control voltage. In such a case, the clock signal generator may be a phase-lock loop (PLL) device. In other cases, a delay line may be coupled for receiving the differential control voltage, thereby forming a delay-lock loop (DLL) device. In any case, the VCO and the delay line may be configured for generating one or more clock signals, one of which is fed back to the phase frequency detector as the feedback clock signal.

BRIEF DESCRIPTION OF THE DRAWINGS

Other objects and advantages of the invention will become apparent upon reading the following detailed description and upon reference to the accompanying drawings in which.

Figure 1A:
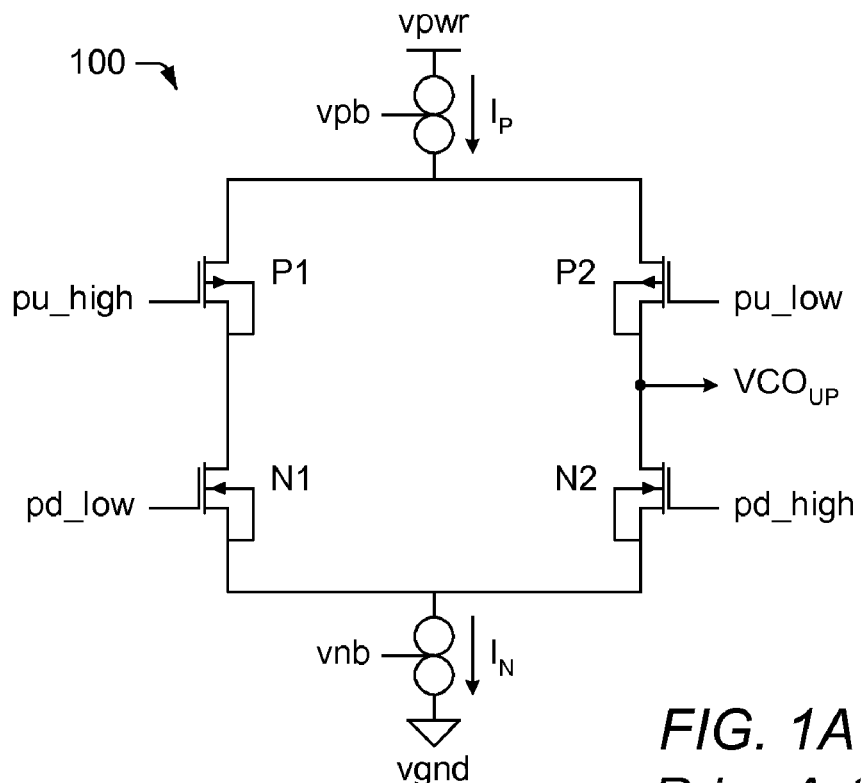
FIGS. 1A and 1B are circuit diagrams of a conventional charge pump circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Exemplary embodiments of an improved charge pump circuit will be described in reference to FIGS. 4–6. In a general aspect, the improved charge pump includes a differential charge pump with resistively attenuated inputs. In order to accommodate low power supply voltages (e.g., less than about 1.2V), low threshold voltage ($V_T$) switching transistors are used to keep the current source and current sink of the charge pump in saturation. Unfortunately, driving low $V_T$ transistors with full-rail voltages often forces the switching transistors into the triode region when the switching transistors are turned "on."

As used herein, the term "triode region" refers to the transistor operating region in which the drain-to-source current ($I_{DS}$) is strongly dependent on the drain-to-source voltage ($V_{DS}$) across the transistor. A transistor is said to operate within the "triode" or "nonsaturated" region when the magnitude of $V_{DS}$ is substantially greater than (or equal to) zero and less than (or equal to) the saturation voltage (where $V_{DSAT}=V_{GS}-V_T$). Since $I_{DS}$ VS. $V_{DS}$ characteristics are linear within most of the triode region, the region may be alternatively referred to as the "linear region" of operation. Once a transistor reaches saturation, however, the drain-to-source current ($I_{DS}$) will remain relatively constant even with changes in $V_{DS}$ (ignoring channel length modulation). This region is often referred to as the "saturation region" or "active region," and occurs when the magnitude of $V_{DS}$ is substantially greater than the transistor saturation voltage, $V_{DSAT}$.

Forcing the switching transistors to operate within the triode region tends to increase the Miller Capacitance (Cgd) between the gate and drain regions of the switching transistors. The increased Miller Capacitance increases the difference between the Miller Capacitance currents generated at the output nodes of the charge pump (since I=C*dV/dt). When incorporated within a phase-lock loop (PLL), the difference in current at the output nodes of the charge pump may cause the PLL to generate a charge in the opposite direction to cancel out the difference during lock. The excess charge may then increase the static phase offset between the reference and feedback clock signals input to the PLL.

To maintain a constant and relatively low Cgd, the input signals supplied to the charge pump may be attenuated to reduce the input voltage swing. The amount of attenuation may be generally described as one that enables the switching transistors to stay within (or at least relatively close to) the saturation region when in the "on" state. As described in more detail below, the reduced input voltage swing may function to stabilize the magnitude of the Miller Capacitance (Cgd) over the entire operating range of the charge pump. By stabilizing the Cgd on the switching transistors, the capacitive current spikes generated at the charge pump output nodes can be closely matched. This enables the capacitive current spikes to be subtracted from the differential currents, when supplied to a downstream filter circuit, thereby greatly reducing the static phase offset between the reference and feedback clock signals.

Figure 4A:
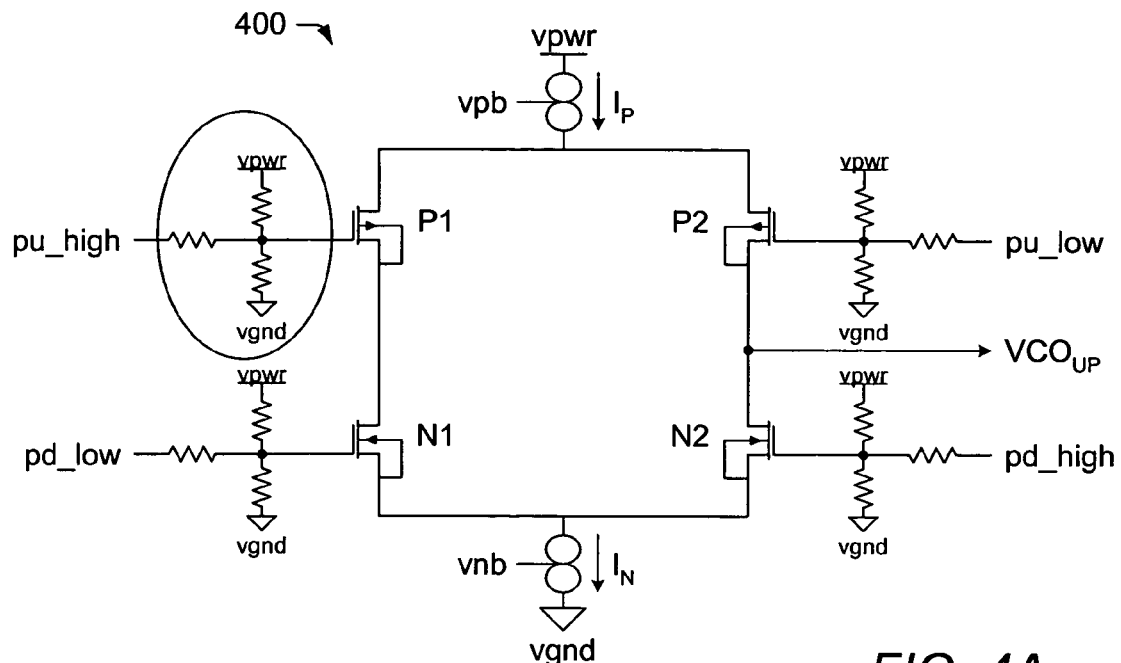
FIGS. 4A and 4B are circuit diagrams of an improved charge pump circuit, according to one embodiment of the invention.
Figure 4B:
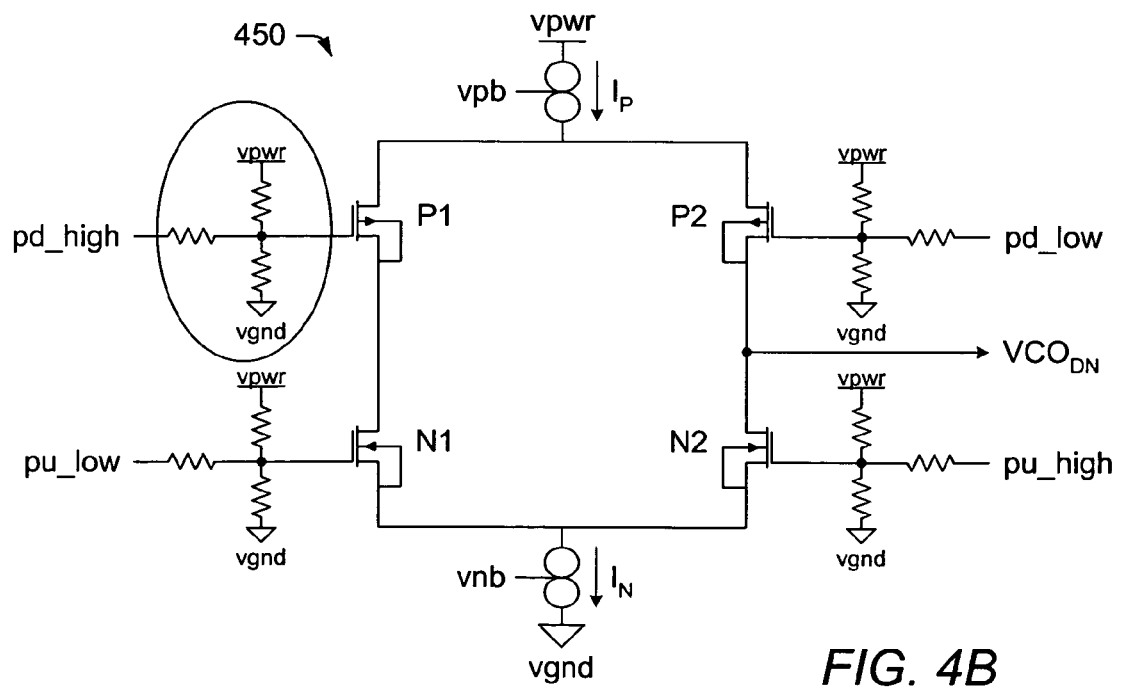

An improved charge pump circuit according to one embodiment of the invention is shown in FIGS. 4A–4B. Similar to the conventional design, the charge pump architecture described herein generally includes two identically-formed differential current-steering circuits 400, 450, one for supplying a positive control voltage ($VCO_{UP}$), and one for supplying a negative control voltage ($VCO_{DN}$) to the VCO. The current-steering circuits of FIGS. 4A and 4B may also each include an NMOS current source ($I_N$), a PMOS current source ($I_P$), two NMOS switching transistors (N1, N2) and two PMOS switching transistors (P1, P2). In a preferred embodiment, the NMOS switching transistors may be substantially equal in size, whereas the PMOS switching transistors may also be substantially equal in size. However, the sizes of the NMOS and PMOS switching transistors will most likely be different. In general, the size of the switching transistors may be made as small as possible to reduce the Miller capacitance and to ensure that the attenuated input voltage is able to fully turn the switching transistors "on" and "off."

In the specific embodiment of FIGS. 4A–4B, the source terminals of switching transistors P1 and P2 are tied together and coupled to the PMOS current source for receiving a pull-up current ($I_P$). More specifically, the PMOS current source is coupled between the power supply voltage (vpwr) and the source terminals of the PMOS switching transistors, and is adapted for receiving a bias voltage (vpb). In some cases, the PMOS current source may be implemented with a PMOS transistor with it's gate tied to an appropriate bias voltage. The bias voltage may be set to maintain the PMOS current source in a fully conducting or "saturation" state. As noted above, a transistor is considered to be in "saturation" if its drain-to-source voltage ($V_{DS}$) is greater than $V_{DSAT}$.

The source terminals of switching transistors N1 and N2 are also tied together and coupled to the NMOS current source for receiving a pull-down current ($I_N$). More specifically, the NMOS current source is coupled between the source terminals of the NMOS switching transistors and the ground supply voltage (vgnd). Like its counterpart, the NMOS current source is adapted for receiving a bias voltage (vnb), which may be set for maintaining the NMOS current source in saturation. In some cases, the NMOS current source may be implemented with an NMOS transistor with it's gate tied to an appropriate bias voltage. In most cases, the PMOS and NMOS current sources may be configured to provide substantially identical pull-up and pull-down currents. In doing so, the circuit designer may avoid complicating the AC dynamics of the charge pump loop.

The drain terminals of transistors P1 and N1 are coupled together, while the drain terminals of transistors P2 and N2 are coupled together. The positive and negative charge pump output currents (or voltages) are obtained from the output nodes ($VCO_{UP}$ and $VCO_{DN}$) arranged between transistors P2 and N2 of current-steering circuits 400, 450. The output currents delivered to the $VCO_{UP}$ and $VCO_{DN}$ nodes are generally dependent on the state of the inputs (pd_low, pd_high, pu_high, pu_low) received from an upstream PFD circuit (not shown).

In order to accommodate a relatively low power supply voltage (e.g., less than about 1.2 V), switching transistors P1, P2, N1 and N2 may be fabricated with relatively low threshold voltages to keep the NMOS and PMOS current sources in saturation. For example, the PMOS and NMOS switching transistors may be fabricated with a nominal threshold voltage ($V_T$) of approximately 270 mV to 290 mV, in some embodiments of the invention. Other threshold voltages may be appropriate depending on the particular power supply voltage and process technology used. The reduction in threshold voltage may be achieved by any suitable technique, such as by omitting the channel implant during fabrication of the switching transistors, or by reducing the thickness of the gate oxide of the switching transistors. In some cases, the threshold voltage may be (further) reduced by tying the bulk node of the switching transistor to it's source node. In this manner, the threshold voltages of switching transistors P1, P2, N1 and N2 may differ from typical PMOS and NMOS threshold voltages. By using relatively low $V_T$ transistors, differential charge pump circuits 400, 450 may be particularly well suited to applications involving low power supply voltages, such as supply voltages on the order of 1.0 volts.

However, and as noted above, low $V_T$ transistors are often forced into the triode region when driven with full-rail input voltage swings. When operating within this region, capacitive current spikes may be generated at the switching point of transistors P1, P2, N1 and N2 due to changes in the internal Miller Capacitance. In order to avoid the capacitive current spikes, the voltage swing of the input signals supplied to the charge pump circuits may be reduced to ensure that the switching transistors no longer enter the triode region when "on." This may be accomplished, in some embodiments, by inserting a Y-network resistor attenuator (circled in FIGS. 4A and 4B) in the path from the PFD to each input of the differential charge pump. As shown in FIGS. 4A and 4B, the Y-network resistor attenuator generally includes three resistors, two of which (R1, R2) are coupled in series between a power supply voltage (vpwr) and ground (vgnd). In some embodiments, the power supply voltage supplied to resistors R1 and R2 may be substantially the same as the one supplied to the PMOS switching transistors. However, the power supply voltage can be different, in other embodiments, if the resistors of the Y-network attenuator are adjusted to account for the difference. The third transistor (R3), which is coupled in parallel between resistors R1 and R2 of the Y-network, is coupled in series to a gate terminal of one of the switching transistors. In other embodiments, the Y-network may be formed with transistors or a combination of resistors and transistors.

When an input voltage (Vin) is supplied to the charge pump circuit, the output voltage (Vout) generated by each of the Y-network resistor attenuators of FIGS. 4A and 4B may be expressed as:

$$V_{out} = \frac{(R2Vin + R1Vpwr)R3}{R1R2 + R2R3 + R3R1} \qquad \text{EQ. (1)}$$

By coupling a Y-network resistor attenuator to each input of the differential charge pump, the full-swing input signals (pd_low, pd_high, pu_high, pu_low) may each be reduced by approximately 40 to 45%, in some embodiments of the invention. It is noted, however, that the resistive values of R1, R2 and R3 may be modified, as necessary, to attenuate the input signals by a lesser or greater amount. Though a Y-network configuration is used herein to reduce both the common mode and swing of the input signal, a similar effect may be obtained with alternative attenuator network designs, in other embodiments of the invention. Therefore, the attenuator network described herein is considered to encompass any other attenuating means by which the common mode and swing of an input signal can be reduced by an appropriate amount.

An attenuator network in accordance with the present invention may attack the problem of mismatched Miller Capacitance (Cgd) currents by reducing at least two of the variables in the I=C*dV/dt equation. For example, the attenuator network may reduce the voltage swing of the input signal (Vin) to reduce the dV in the dV/dt portion of the equation. The attenuator network may also function to keep the Cgd within each switching transistor fairly constant between "on" and "off" states (e.g., to prevent the switching transistors from entering the triode region). Since the Miller Capacitance is smaller in the saturation region, keeping the switching transistors in saturation also reduces the magnitude of the Miller Capacitance currents. By matching the Cgd of an "on" transistor to that of an "off" transistor, the relatively low magnitude, matched Miller Capacitances can be effectively canceled out in a differential signal.

In some cases, the attenuator network can be designed with relatively high output impedance to slow the edge rates of the input signal (Vin) to decrease the dt in the dV/dt portion of the equation. For example, once the resistor ratios are calculated for obtaining a desired common mode and input voltage swing, the resistor values can be scaled up to increase the effective output impedance of the attenuator network. This may increase the time constant (dt) of the attenuator output signal (Vout) to further reduce the Miller Capacitance current (I=C*dV/dt).

An improved charge pump circuit with resistively attenuated inputs has been described herein. As noted above, low threshold voltage switching transistors can be operated within the saturation region by attenuating the voltage supplied to their gate terminals, and therefore, reducing the voltage swing of the input signals supplied to the charge pump. The reduced voltage swing functions to limit the excess gate voltage (where "excess" may be described as an amount of voltage above $V_T$) when the switching transistors are turned on. The limited gate voltage prevents the transistor operating region from creeping up the steep part of the gate-to-drain capacitance curve. This keeps the Miller Capacitance (Cgd) relatively constant and allows the capacitive current spikes to be matched between the differential output nodes of the charge pump circuit. When matched current spikes are supplied to a loop filter, the net excess charge present on the loop filter capacitor will cancel out in the differential control voltage, resulting in little to no additional static phase offset.

Figure 5:
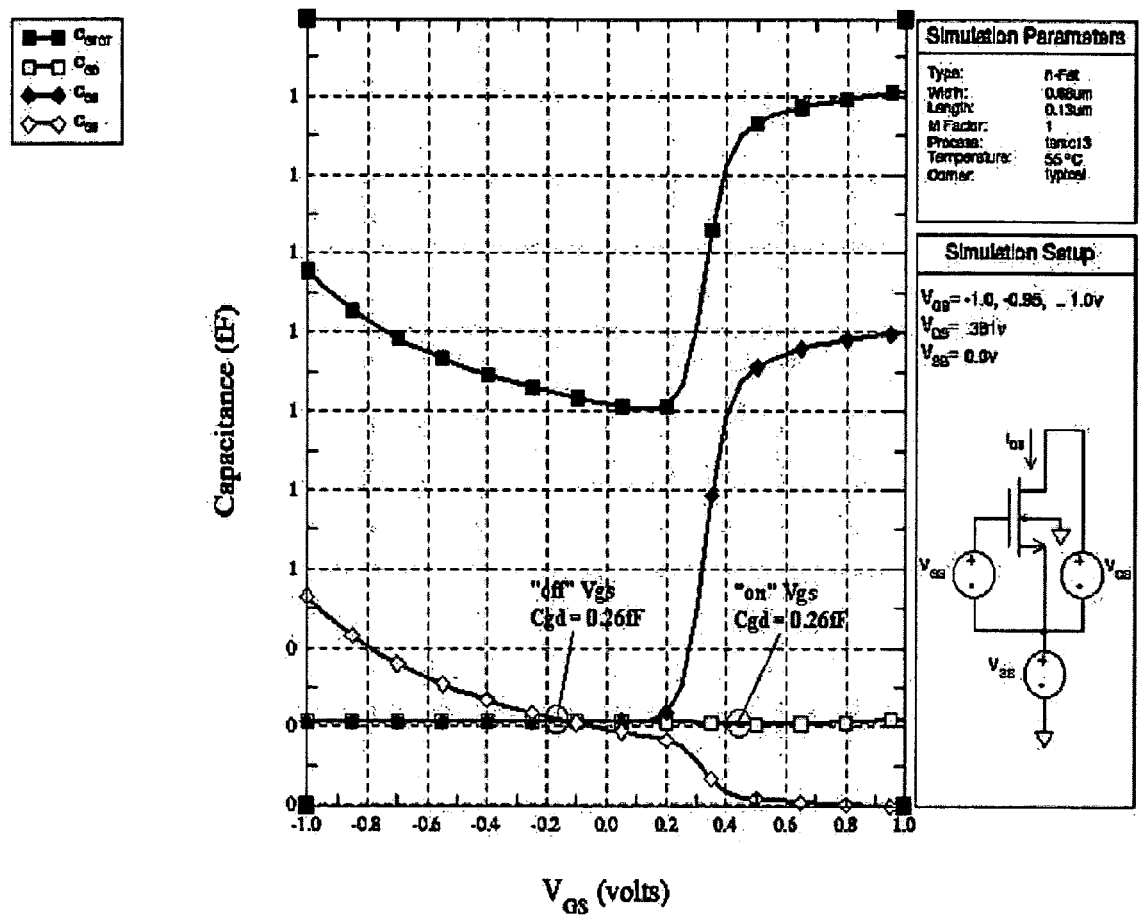
FIG. 5 is a capacitance curve for the charge pump circuit of FIGS. 4A and 4B.

FIG. 5 illustrates a capacitance curve for one of the NMOS switching transistors in the differential charge pump of FIGS. 4A and 4B. The horizontal axis of FIG. 5 represents the gate-to-source voltage ($V_{GS}$) of an NMOS switching transistor expressed in volts. The vertical axis of FIG. 5 represents a change in the Millar Capacitance (expressed in femto-Farrads, fF) between "on" and "off" states of the NMOS switching transistor. FIG. 5 shows that the Miller capacitance (Cgd) remains relatively constant at approximately 0.26 fF, and therefore, is relatively well matched between the "on" and "off" states of the switching transistor. In other words, the reduced gate voltage supplied to the switching transistor prevents the transistor from changing regions of operation and keeps the Miller Capacitance relatively constant over the entire operating range of the charge pump. In turn, the constant capacitance may help to reduce (or substantially eliminate) any static phase offset that may have been introduced into the charge pump output signals.

Figure 1B:
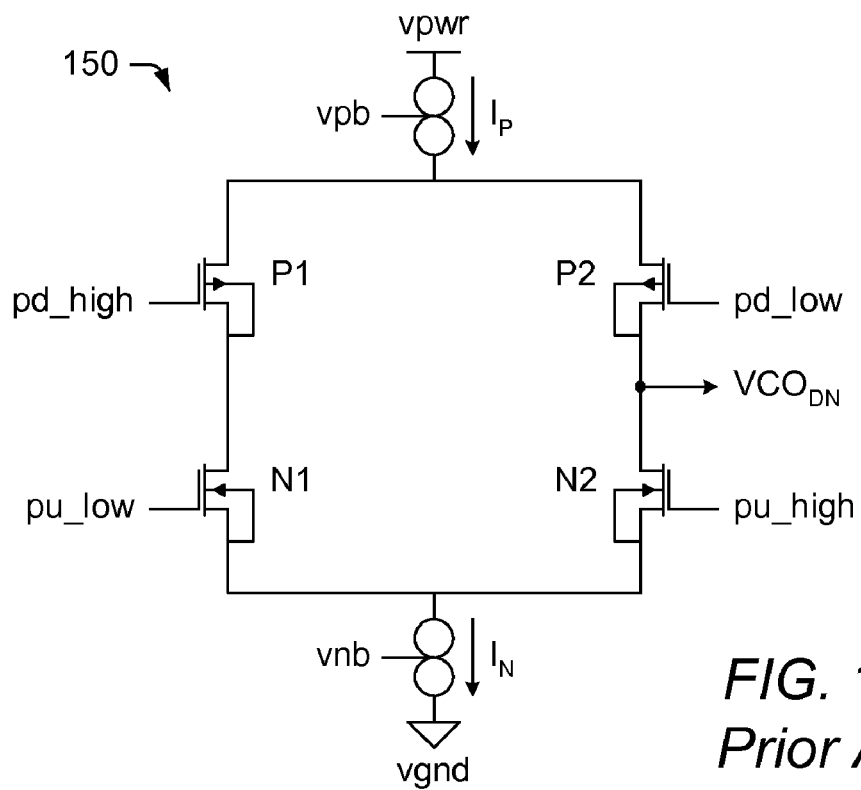
Figure 2:
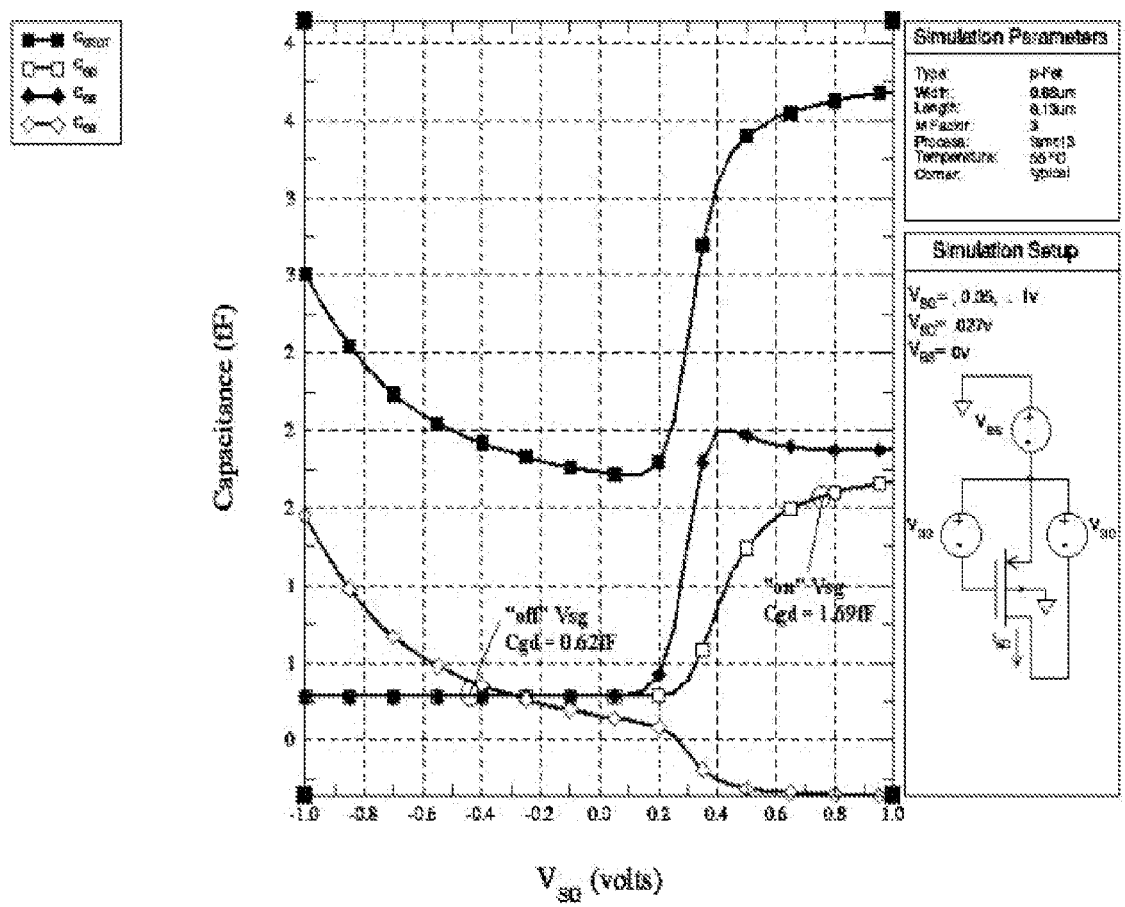
FIG. 2 is a capacitance curve for the charge pump circuit of FIG. 1.
Figure 3:
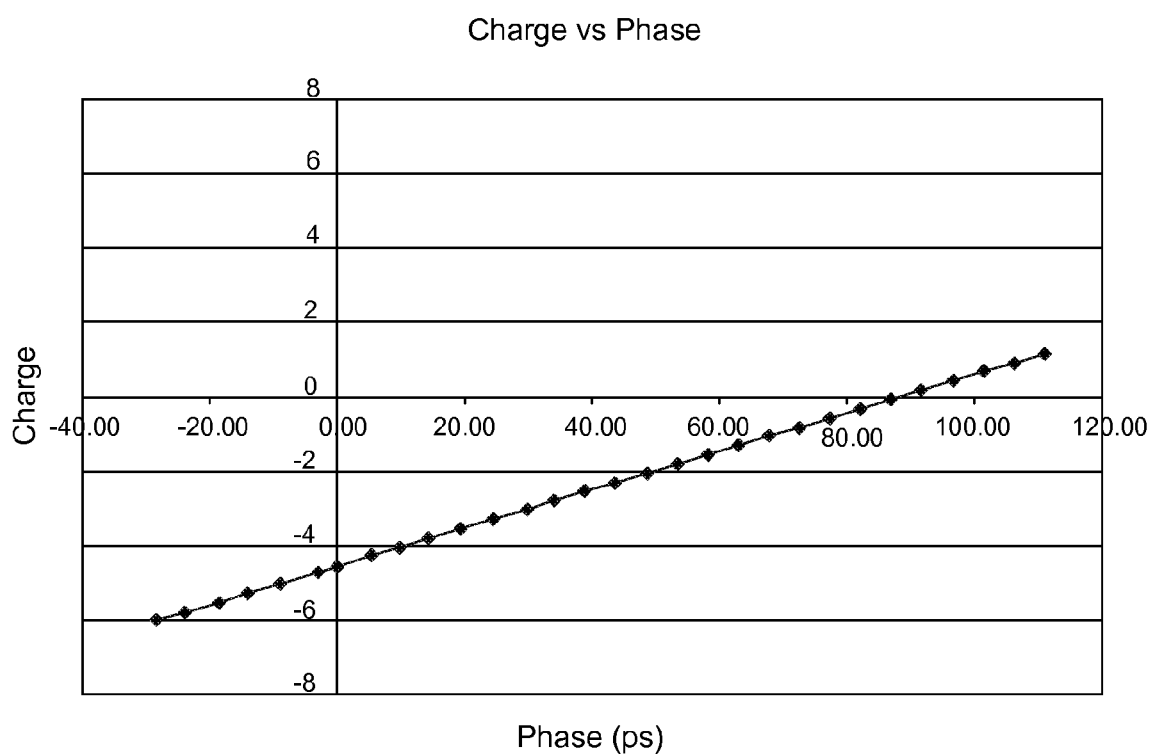
FIG. 3 is a charge vs. phase plot for the charge pump circuit of FIG. 1.
Figure 6:
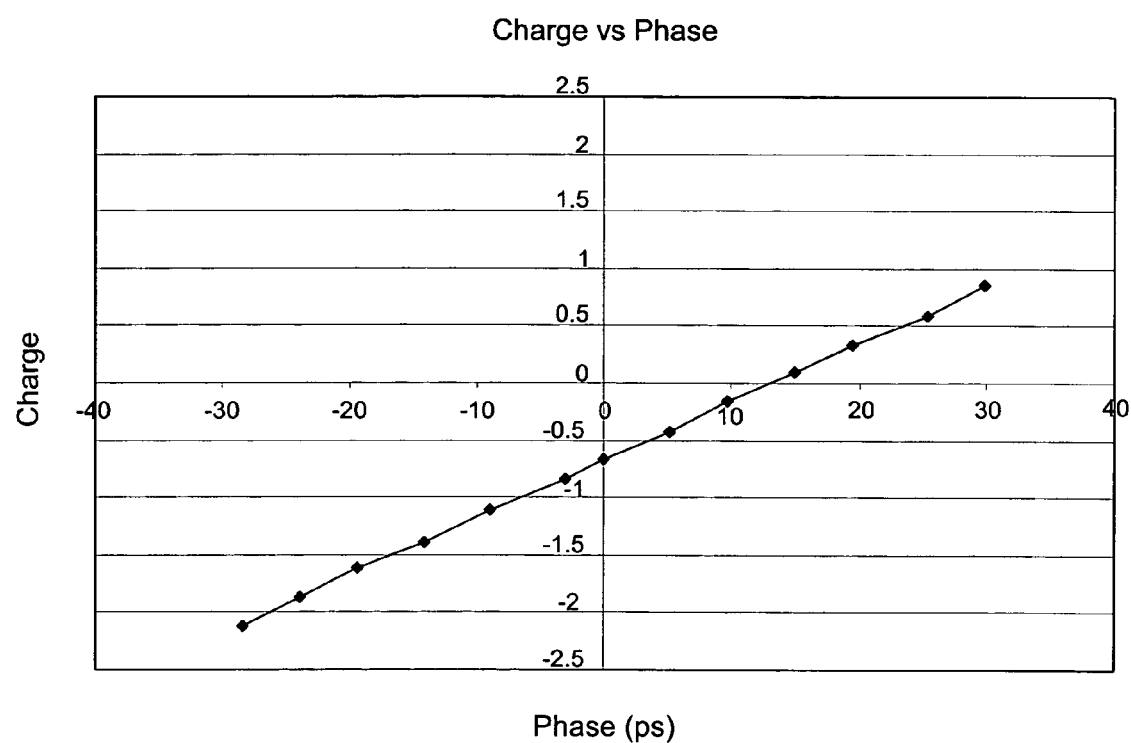
FIG. 6 is a charge vs. phase plot for the charge pump circuit of FIGS. 4A and 4B.

FIG. 6 illustrates a charge vs. phase plot simulated at a typical process corner and maximum VCO control voltage for the charge pump circuit shown in FIGS. 4A and 4B. The horizontal axis of FIG. 6 represents the phase offset expressed in picoseconds (ps). The vertical axis of FIG. 6 represents the charge delivered to the loop filter capacitor expressed in coloumbs. As shown in FIG. 6, the improved charge pump circuit exhibits a static phase offset of about 13 ps; a vast improvement over the 90 ps provided by the conventional charge pump of FIGS. 1A and 1B. In other words, the improved charge pump circuit produces a static phase offset, which is approximately 7 times less than the phase offset produced in conventional circuits, by resistively attenuating the inputs to the charge pump. The phase offset generated by the improved charge pump circuit may be reduced, in some embodiments, by specifically designing the circuit for operation at a particular process corner.

Figure 7:
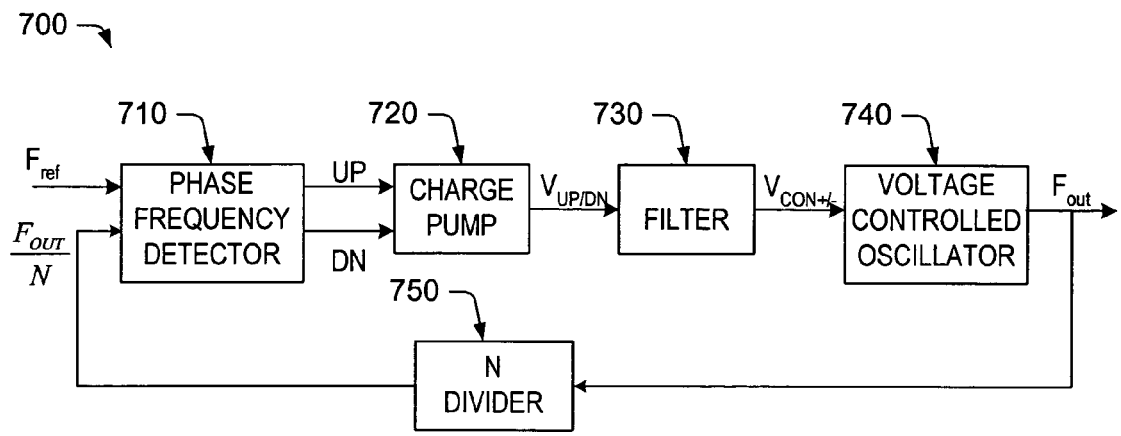
FIG. 7 is a block diagram of an exemplary Phase-lock loop (PLL) device including the charge pump circuit of FIGS. 4A and 4B.

FIG. 7 is a block diagram of an exemplary phase-locked loop (PLL) device 700 including phase frequency detector (PFD) 710, charge pump 720, loop filter 730 and voltage controlled oscillator (VCO) 740. Phase frequency detector 710 compares the phase of the feedback signal (e.g., $F_{OUT}/N$) to the reference signal ($F_{REF}$). The difference between the reference and feedback signals (expressed as full-swing "UP" or "DN" signals) is supplied to charge pump 720. The charge pump receives the "UP" and "DN" signals and provides an error signal for driving loop filter 730, typically comprising a resistor and one or more capacitors coupled between the loop filter input and ground. Loop filter 730 filters the error signal generated by charge pump 720 and supplies a differential control voltage ($V_{CON+/-}$) to VCO 740. The control voltage can then be used for adjusting the frequency and/or phase of the oscillator clock (i.e., a feedback clock output from VCO 740) until a transition of the feedback clock aligns with a transition of the reference clock. At such a time, the PLL "locks" the phase of the PLL output clock.

In some cases, frequency divider 750 may be used to divide the frequency of one of the VCO output signals ($F_{OUT}$) to produce the feedback signal ($F_{OUT}/N$). In the embodiments that include frequency divider 750, PLL 700 may function as a frequency multiplier. However, frequency divider 750 may not be included in all embodiments of the invention. In such embodiments, the VCO output signal ($F_{OUT}$) may be fed back to phase frequency detector 710.

Figure 8:
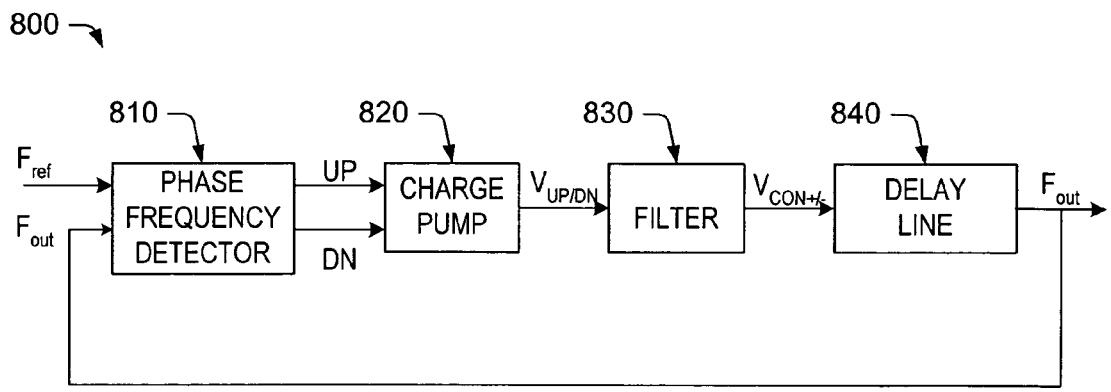
FIG. 8 is a block diagram of an exemplary Delay-lock loop (DLL) device including the charge pump circuit of FIGS. 4A and 4B.

FIG. 8 is a block diagram of an exemplary delay-locked loop (DLL) device 800 including phase frequency detector (PFD) 810, charge pump 820, loop filter 830 and delay line 840. A fundamental difference between PLL and DLL devices is that, instead of a voltage-controlled oscillator (VCO), a DLL uses a delay line to generate one or more phases of the reference clock signal. Similar to PLL 700, the phase frequency detector 810 compares the phase of the feedback clock ($F_{OUT}$) to the phase of the reference clock ($F_{REF}$). The difference between the reference and feedback clock signals (expressed as full-swing "UP" or "DN" signals) is supplied to charge pump 820. The charge pump receives the "UP" and "DN" signals and provides an error signal for driving loop filter 830. Loop filter 830 filters the error signal and adjusts the delay of the delay line 840 by supplying a differential control input ($V_{con+/-}$) to delay line 840. The combined actions of PFD 810, charge pump 820 and filter 830 cause delay line 840 to produce a delay, which is substantially equal to an integer number of the reference periods.

Delay line 840 can be built using a voltage-controlled delay, or alternatively, using a series of discrete delay elements. In any case, a DLL generally works by inserting an amount of delay between the reference and feedback clock signals until transitions of the two signals align, usually 360° out of phase with one another. Once a transition of the feedback signal aligns with a transition of the reference clock signal, the DLL "locks" the phase of the DLL output clock.

Regardless of whether charge pump 720/820 is implemented within a PLL or DLL device, charge pump 720/820 is preferably implemented as described above in reference to FIGS. 4A and 4B. As such, charge pump 720/820 may receive error correcting signals from PFD 710/810 in the form of full-swing "UP" or "DN" signals. However, the full-swing error signals may be attenuated to keep the switching transistors of the charge pump in saturation. As noted above, the attenuation of the input signals stabilizes the Miller Capacitance of the switching transistors and reduces the difference in current at the output nodes of the charge pump circuit. Since any spikes in the output current will be closely matched by charge pump 720/820, they may be canceled out in the differential control signal generated by loop filter 730/830. This may enable the PLL or DLL device to generate output signals, which track the reference signal with relatively little static phase offset. In some cases, charge pump 720/820 may be included within phase frequency detector 710/810, although the components are shown separately in FIGS. 7 and 8.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A differential charge pump circuit configured for receiving a plurality of differential input signals, wherein a first portion of the differential charge pump comprises:

a current source coupled to a power supply, which is configured for supplying a voltage of less than about 1.2 volts to the differential charge pump circuit;

a current sink coupled to a ground supply;

a first pair and a second pair of serially-coupled CMOS transistors, wherein the first and second pairs are coupled in parallel between the current source and the current sink; and a plurality of attenuators, each coupled to a different gate terminal of the first and second pairs of serially-coupled CMOS transistors for reducing an amplitude of the plurality of input signals supplied to the differential charge pump circuit.

2. The differential charge pump circuit as recited in claim 1, wherein the first pair of serially-coupled CMOS transistors comprises a first p-channel transistor and a first n-channel transistor coupled in series between the current source and the current sink, and wherein the second pair of serially-coupled CMOS transistors comprises a second p-channel transistor and a second n-channel transistor coupled in series between the current source and the current sink.

3. The differential charge pump circuit as recited in claim 2, wherein the first and second p-channel transistors and the first and second n-channel transistors comprise threshold voltages ranging between about 270 mV and about 290 mV.

4. The differential charge pump circuit as recited in claim 2, wherein each of the plurality of attenuators comprises one or more resistors.

5. The differential charge pump circuit as recited in claim 2, wherein each of the plurality of attenuators comprises a Y-network of three resistors.

6. The differential charge pump circuit as recited in claim 5, wherein two of the three resistors in the Y-network are coupled in series between the power supply and the ground supply, while a third is coupled to a gate terminal within the first and second pair of serially-coupled CMOS transistors.

7. The differential charge pump circuit as recited in claim 2, further comprising a second portion formed substantially identical to the first portion of the differential charge pump circuit, wherein the first and second portions are configured for producing a positive and negative error signal, respectively, depending on a state of the differential input signals supplied to the differential charge pump circuit.

8. The differential charge pump circuit as recited in claim 2, wherein the plurality of differential input signals each comprise a peak-to-peak amplitude extending between the power supply and the ground supply.

9. The differential charge pump circuit as recited in claim 2, further comprising an output node arranged between the second p-channel transistor and the second n-channel transistor and configured for producing an error signal.

10. A method for operating a differential charge pump circuit comprising the steps:

receiving a plurality of input signals;

attenuating the plurality of input signals by passing each of the input signals through a separate resistor network coupled to a different input of the differential charge pump circuit; and supplying the attenuated input signals to the differential charge pump circuit, instead of the input signals themselves.

11. The method as recited in claim 10, wherein a magnitude of each of the plurality of input signals can range between a power supply voltage level and a ground supply voltage level supplied to the differential charge pump circuit.

12. The method as recited in claim 10, wherein the step of attenuating the plurality of input signals comprises reducing the magnitude of each of the plurality of input signals by approximately 40 to 45%.

13. A clock signal generator, comprising:

a phase frequency detector coupled for receiving and comparing a reference clock signal with a feedback clock signal and configured for generating a plurality of differential signals representative of a difference therebetween; and a charge pump coupled for receiving the plurality of differential signals and comprising a first portion and a second portion, wherein each portion comprises:

a current source coupled to a power supply;

a current sink coupled to a around supply;

a plurality of attenuators configured for reducing a voltage swing of the plurality of differential signals supplied to the charge pump; and a first pair and a second pair of serially-coupled CMOS transistors, wherein the first and second pairs are coupled in parallel between the current source and the current sink, and wherein each transistor within the first and second pairs is coupled for receiving a reduced voltage swing signal from a different one of the plurality of attenuators.

14. The clock signal generator as recited in claim 13, wherein each of the plurality of attenuators comprise one or more resistors.

15. The clock signal generator as recited in claim 13, wherein each of the plurality of attenuators comprise a Y-network of three resistors.

16. The clock signal generator as recited in claim 13, further comprising a filter circuit coupled for receiving a pair of currents generated by the charge pump and configured for producing a differential control voltage by canceling matched capacitive current spikes generated within the first and second pairs of serially-coupled CMOS transistors when one of the transistors is in an "on" state and another is in an "off" state.

17. The clock signal generator as recited in claim 16, further comprising a voltage controlled oscillator coupled for receiving the differential control voltage and configured for generating one or more clock signals, one of which is fed back to the phase frequency detector as the feedback clock signal.

18. The clock signal generator as recited in claim 16, further comprising a delay line coupled for receiving the differential control voltage and configured for generating one or more clock signals, one of which is fed back to the phase frequency detector as the feedback clock signal.

19. The clock signal generator as recited in claim 13, wherein the power supply is configured for supplying a voltage of less than about 1.2 volts to the differential charge pump circuit, and wherein each transistor within the first and second pairs of serially-coupled CMOS transistors comprises a threshold voltage ranging between about 270 mV and about 290 mV.

* * * * *

UNITED STATES PATENT AND TRADEMARK OFFICE
CERTIFICATE OF CORRECTION

| | |
|---|---|
| PATENT NO. | : 7,183,822 B1 |
| APPLICATION NO. | : 10/927979 |
| DATED | : February 27, 2007 |
| INVENTOR(S) | : Bolton et al. |

It is certified that error appears in the above-identified patent and that said Letters Patent is hereby corrected as shown below:

Col. 12, line 16: delete "around" and substitute --ground--.

Signed and Sealed this

First Day of May, 2007

JON W. DUDAS
*Director of the United States Patent and Trademark Office*